United States Patent [19]
Dennison et al.

[11] 3,983,544
[45] Sept. 28, 1976

[54] SPLIT MEMORY ARRAY SHARING SAME SENSING AND BIT DECODE CIRCUITRY

[75] Inventors: Richard Thomas Dennison, Hopewell Junction; Leo Boyes Freeman, Poughkeepsie; Helen Janet Kelly, Wappingers Falls; Peter Tsung-Shih Liu, Wallkill, all of N.Y.

[73] Assignee: International Business Machines Corporation, Armonk, N.Y.

[22] Filed: Aug. 25, 1975

[21] Appl. No.: 607,330

[52] U.S. Cl. .............................. 340/173 R; 307/238; 340/173 CA
[51] Int. Cl.[2] ........................................ G11C 7/00
[58] Field of Search.... 340/173 R, 173 CA, 173 FF; 307/238; 357/45

[56] References Cited
UNITED STATES PATENTS

| | | |
|---|---|---|
| 3,798,621 | 3/1974 | Baitinger et al. ................ 307/238 X |
| 3,820,086 | 6/1974 | Ho et al. ......................... 340/173 FF |
| 3,821,715 | 6/1974 | Hoff et al. ......................... 307/238 X |
| 3,882,326 | 5/1975 | Kruggel ............................ 307/238 X |
| 3,949,381 | 4/1976 | Dennard et al. .............. 340/173 CA |

*Primary Examiner*—David L. Trafton
*Attorney, Agent, or Firm*—Robert J. Haase

[57] ABSTRACT

A split random access memory array is integrated with a read only storage array and shares the same sense and bit decode circuitry. Each bit line of the integrated array is provided with an isolation switch between the random access and read only portions. The switch conducts when reading the read only portion but does not conduct (isolates) when writing or reading the random access portion. The isolation switch also permits the initialization of the shared differential sensing latch and facilitates the rapid writing and reading of the random access portion by removing the bit line loading due to the read only portion on such occasions.

8 Claims, 3 Drawing Figures

3,983,544

SPLIT MEMORY ARRAY SHARING SAME SENSING AND BIT DECODE CIRCUITRY

BACKGROUND OF THE INVENTION

As higher levels of integration are achieved, with the ultimate goal being a computer on a wafer or on a chip, all system functions are to be provided for on the same slice of silicon. The total integration of the diverse logic functions and of the diverse memory functions preferably is accomplished with a minimum of hardware and in such a manner that performance is not sacrificed. In this connection, it is advantageous to integrate a read/write memory array and a read only memory array into a single array chip in order to accomplish chip area savings over separate and independent arrays. One such integration technique is disclosed in U.S. Pat. No. 3,820,086, issued June 25, 1974 to Irving T. Ho et al, entitled "Read Only Memory (ROM) Superimposed on Read/Write Memory (RAM)" and assigned to the present assignee. Said patent discloses a memory array comprising dual mode memory cells wherein each cell is capable of simultaneously reading out the information contained in the cell by virtue of its read/write mode of operation as well as its read/only mode of operation. Although considerable memory area savings are realized by application of the aforesaid invention, the number of bits in the read/only memory cannot exceed the number of bits in the read/write memory. A need exists, however, for integrated memories where the number of read only bits substantially exceed the number of read/write bits.

SUMMARY OF THE INVENTION

Memory array area is reduced at the same time that memory performance is preserved by integrating a first memory array on the same chip with a second memory array which share the same sense and bit decode circuitry. The first array is selectively isolated from the second array by isolating switches located on the respective bit lines between the two arrays. In the disclosed embodiment, the first array is a split random access array, i.e., the array being divided into two portions located on opposite sides of sensing circuitry, and the second array is a read only array. The isolation switch permits the read only bit line portion to be initialized to a voltage lower than the voltage of the simultaneously initialized random access bit line portions. The initialized read only bit line potential remains unchanged when reading "0" from the read only array and rises to a voltage higher than the initialized random access bit line voltage when reading a binary "1" from the read only array. The reading of a binary "0" from a random access cell changes the respective initialized random access bit line voltage in one direction while the reading of a binary "1" from a random access cell changes the respective initialized random access bit line voltage in the opposite direction. These actions permit the same differential sense amplifier (latch) to be used when reading either the read only or the random access array cells. Rapid writing and reading of the random access array is achieved by rendering the isolation switches non-conductive thus removing the capacitance loading of the read only bit line portions which otherwise would slow down such operation.

The foregoing and other objects, features and advantages of the invention will be apparent from the following more particular description of the preferred embodiment of the invention, as illustrated in the accompanying drawing.

DESCRIPTION OF THE PREFERRED EMBODIMENT

Figure 1:
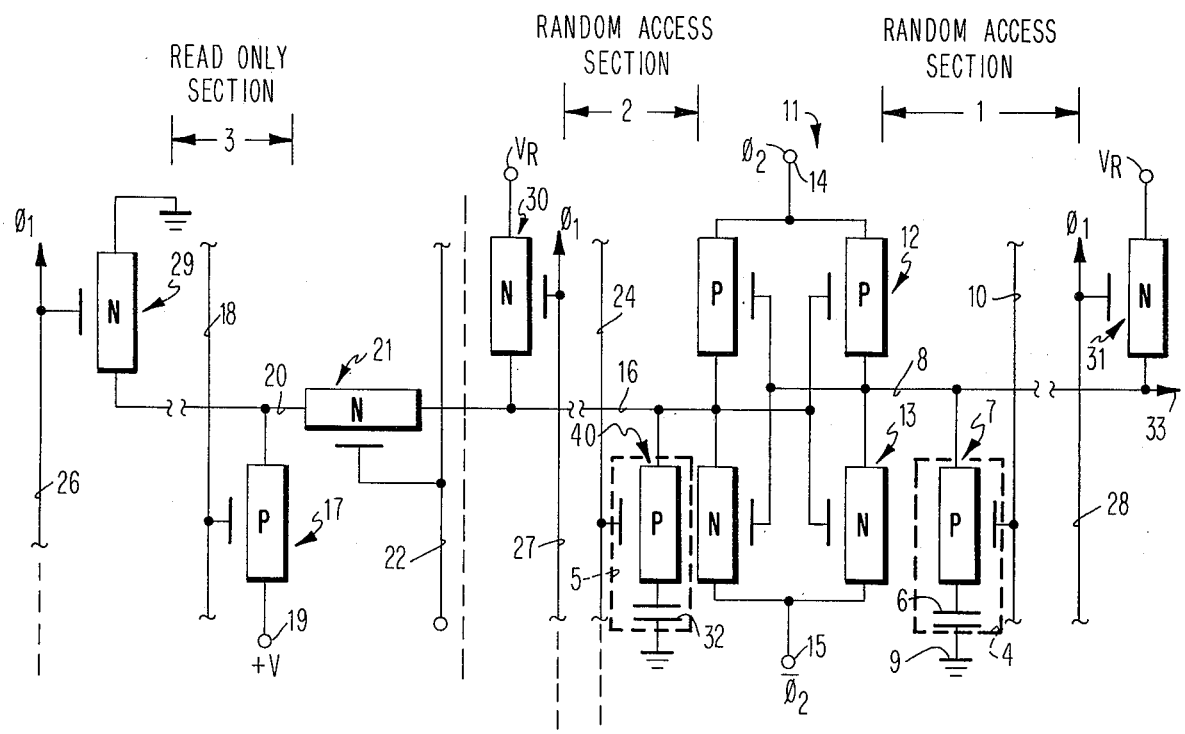
FIG. 1 is a simplified schematic diagram of a single bit line of an integrated array in accordance with the present invention.

Referring to FIG. 1, each bit line of the integrated array in accordance with the present invention is divided into three sections. Sections 1 and 2 each comprise a plurality of dynamic storage cells represented by storage cells 4 and 5. Each dynamic storage cell comprises a capacitive storage element such as element 6 connected in series circuit with field effect transistor 7 between bit line portion 8 and ground 9. The data stored in typical cell 4 is represented by the change or absence of charge on capacitor 6 in a conventional manner. The data is written into and sensed from capacitor 6 by addressing cell 4 by application of a pulse on word line 10 to render FET 7 conductive.

The dynamic storage cells of sections 1 and 2 constitute a split random access array whose halves are separated by selectively energized differential sense amplifier 11 arranged in the form of a latching circuit. Each half of the latch comprises a pair of opposite conductivity type field effect transistors such as transistors 12 and 13 which are connected in series circuit between a pair of pulsed voltage terminals 14 and 15 designated $\phi_2$ and $\overline{\phi_2}$, respectively. As will be more fully discussed later, latch 11 responds to a relatively small difference in potential between bit line portions 8 and 16 upon application of energization potentials $\phi_2$ and $\overline{\phi_2}$, and increases the magnitude of the voltage difference between bit line portions 8 and 16 while preserving the sense of that voltage difference.

Section 3 of the bit line comprises a plurality of field effect transistors typified by transistor 17 between bit line portion 20 and potential +V connected at terminal 19. Said transistors are personalized during manufacture by forming or by not forming the FET gate electrode. If the gate electrode is formed during manufacture, transistor 17 would be rendered conductive upon application of a pulse to word line 18. This would charge bit line portion 20 toward the potential +V at terminal 19. The absence of a gate electrode on transistor 17, of course, would preclude conduction upon the application of a pulse to word line 18. Thus, transistor 17 constitutes a single cell of a conventional personalized read only store array. The read only array of bit line portion 3 is selectively isolated from the split random access array of bit line portions 1 and 2 by isolating switch 21. Switch 21 comprises a field effect transistor which is rendered conductive or not conductive by application of appropriate gating signal applied to line 22.

Figure 2:
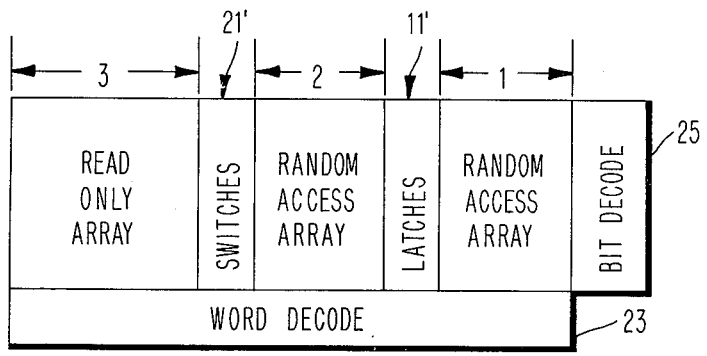
FIG. 2 is a layout diagram of the array of FIG. 1 showing the word decode circuitry and the shared bit decode and sense latch circuitry.

FIG. 2 shows the manner in which a plurality of bit lines such as the bit line of FIG. 1 are arranged to form a composite array wherein the read only and split random access portions of the composite array share the same bit decoding circuitry and sense latch circuitry.

Bit line sections 1, 2, and 3 of FIG. 2 correspond to those of FIG. 1. A plurality of latches 11' of the arrayed bit lines of FIG. 2 correspond to the individual latch 11 of FIG. 1. Likewise, the arrayed switches 21' of FIG. 2 correspond to the individual switch 21 of FIG. 1. Word decode 23 of FIG. 2 selectively energizes appropriate word lines, such as word lines 18, 24, and 10 of FIG. 1 in accordance with input binary address signals (not shown) as is well understood in the art. Similarly, bit decode 25 selectively energizes an appropriate bit line in accordance with input binary address signals (not shown). It will be noted that the read only array and the split random access array are addressed by the same decoded bit lines whereas the read only array and the split random access arrays are addressed by respective decoded word lines. The sharing of the bit decoding circuitry by the read only array and by the random access array reduces the addressing circuitry relative to the case where the two arrays are independent of each other as in prior arrangements. It should also be noted that the latch 11' likewise are shared between the read only array and the random access array affording economy of sensing circuitry as contrasted to the case of independent array configurations.

Figure 3:
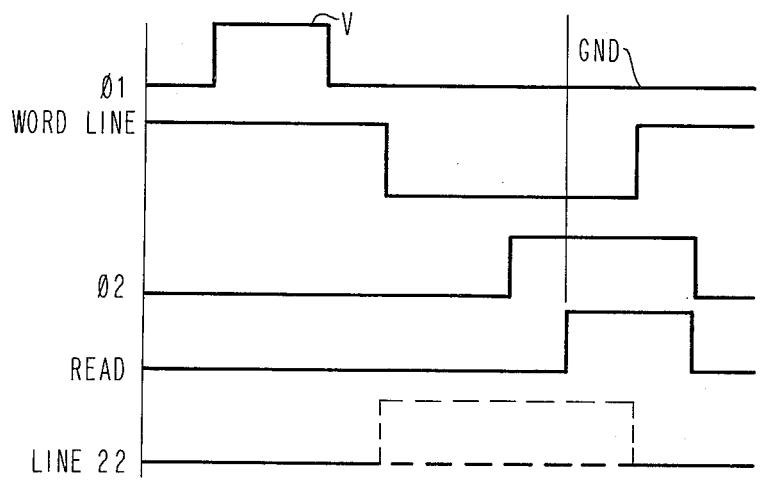
FIG. 3 is a series of idealized timing waveforms for operating the array of FIGS. 1 and 2.

The operation of the array will now be discussed with the aid of FIGS. 1 and 3. Precharge lines 26, 27, and 28 are simultaneously pulsed ($\phi_1$) rendering their respective transistors 29, 30, and 31 conductive to initialize the voltage conditions on the respective bit line portions 20, 16, and 8. Isolation switch 21 is non-conductive during the initialization interval. The conduction of transistor 29 discharges to ground the potential of isolated bit line 20 of portion 3. The conduction of transistor 30 brings the potential of bit line 16 of portion 2 up to $V_R$. The potential $V_R$ is approximately half the amplitude of potential V applied to terminal 19. The conduction of transistor 31 brings bit line 8 of portion 1 up to $V_R$. Bit lines 16 and 8 of portions 2 and 1, respectively, are isolated from each other during the initialization interval by the non-conduction of latch 11.

Upon the completion of initialization, either a read only or a random access memory cell is addressed by a pulse appearing on one of the decoded word lines 18, 24, or 10 which drops the potential on the decoded line from V to ground turning on a respective transistor 17, 40, or 7. If the address is in the read only section, a positive pulse is applied to line 22 rendering isolation switch 21 conductive to couple the read only section 3 to bit line 16 of portion 2. In the further event that the addressed read only memory cell has been provided with gate personalization (stores a binary 1), the voltage on connected bit lines 20 and 16 is raised above $V_R$ toward V by the conduction of transistor 17. In the absence of gate personalization, the potential of bit line 16 discharges toward ground upon the conduction of transistor 21.

To summarize, if a binary "1" is stored in the addressed read only memory cell the potential on bit line 16 to the left of latch 11 rises to voltage V while the potential of bit line 8 to the right of latch 11 remains at the initialized lower voltage $V_R$. In the event that the addressed read only memory cell stores a binary "0", the voltage on bit line 16 at the left of latch 11 falls toward ground while the voltage on bit line 8 to the right of latch 11 remains at the initialized higher potential $V_R$. The difference between the potentials at the opposite sides of latch 11 is amplified upon the occurrence of activating pulses $\phi_2$ and $\overline{\phi_2}$, $\phi_2$ rising to V and $\overline{\phi_2}$ dropping to ground. Following activation, the voltage on bit line 16 rises to V while the voltage on bit line 8 falls to ground (or vice versa) depending upon whether the addressed read only memory cell is storing a binary "1" or a binary "0", respectively.

In the event that the addressed memory cell is in either half of the split random access portion of the composite array, one of the word lines 24 or 10 is activated. In this case, isolation switch 21 remains non-conductive. The activation of word line 24, for example, renders its associated transistor 40 conductive to raise or lower the initialized potential on bit line 16 depending on the charge previously stored in capacitor 32. Similar action follows in the event that word line 10 is addressed and transistor 7 is rendered conductive except that the potential of bit line 8 is driven above or below the initialized potential $V_R$ depending upon the charge previously written into capacitor 6. A relatively small voltage difference is impressed across latch 11 as a result of addressing one of the word lines in the split random access section of the composite array. As before, the relatively small voltage difference is amplified upon the activation of latch 11 so that the potential of bit line 16 rises to V while the potential of bit line 8 falls to ground or vice versa depending upon the binary data stored in the addressed cell. The stored data in the addressed cell is read shortly after the activation of latch 11 as represented by the pulse designated "Read" in FIG. 3. The read pulse activates a gate (not shown) connected to the output portion 33 of the bit line. The relationship between the waveforms are shown in FIG. 3.

Data is written into the individual memory cells of the split RAM array in the following fashion. The potential of an addressed bit line is raised to V or lowered to ground by means of a gate (not shown) connected to the portion 33 of the bit line, depending upon whether a binary "0" or binary "1", respectively, is to be written into a selected random access memory cell. The latch is energized by application of the $\phi_2$ and $\overline{\phi_2}$ pulses and a desired cell is selected by application of a pulse to word line 24 or 10, for example, to render the respective transistors of cells 5 and 4 conductive. If transistor 7 of cell 4 is turned on when portion 33 of the bit line is at V, capacitor 6 is set to voltage V. If the transistor of cell 5 is turned on capacitor 32 is set to ground voltage, due to the inversion produced by latch 11. It should be noted, however, that when cell 5 is read as discussed previously, the ground potential of capacitor 32 lowers the potential of bit line 16 below $V_R$, causing the potential on bit line 8 to rise to V upon energization of latch 11. Thus, a binary "0" is read at output portion 33 of the bit line as the voltage V independent of whether said binary "0" is represented by a voltage of V across the selected memory cell capacitor on the right hand side of latch 11 or by approximately zero volts across the selected memory cell capacitor on the left hand side of latch 11.

While the invention has been particularly shown and described with reference to the preferred embodiment thereof, it will be understood by those skilled in the art that various changes in form and details may be made therein without departing from the spirit and scope of the invention.

What is claimed is:
1. In combination,
  a first array of memory cells,
  a second array of memory cells, the cells of each said array being connected along the same bit rows but along different word columns, a plurality of actuatable switches equal to the number of said bit rows, each bit row of said first array being selectively connectable to the same bit row of said second array upon the actuation of a respective one of said switches, a plurality of sense amplifier means equal to said number of said bit rows, each said amplifier means being connected to a respective bit row within said first array, means for word addressing cells within said second array and concurrently actuating said switches, and means for word addressing cells within said first array while said switches are deactuated.

2. The combination defined in Claim 1 wherein said sense amplifier means are actuatable and further including means for actuating said amplifier means subsequent to the actuation of said switches.

3. The combination defined in claim 1 wherein said sense amplifier means are actuatable and further including means for actuating said amplifier means in overlapping time relationship with the terminal portion of the actuation of said switches.

4. The combination defined in claim 1 wherein said first array is split into two portions along said bit rows and said amplifier means are connected between said portions.

5. The combination defined in claim 1 wherein each said amplifier means is a latch.

6. The combination defined in claim 1 wherein said first and second arrays are formed on the same chip.

7. The combination defined in claim 1 wherein the memory cells of said first array are different from the memory cells of said second array with respect to at least one of the three factors consisting of speed, size and functionality.

8. The combination defined in claim 7 wherein said first array is a random access memory array and said second array is a read only memory array.

* * * * *